(12) United States Patent
Hsiung et al.

(10) Patent No.: US 10,651,126 B2
(45) Date of Patent: May 12, 2020

(54) METHODS AND APPARATUS FOR WAFER-LEVEL DIE BRIDGE

(71) Applicant: APPLIED MATERIALS, INC., Santa Clara, CA (US)

(72) Inventors: Chien-Kang Hsiung, Taipei (TW); Arvind Sundarrajan, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 88 days.

(21) Appl. No.: 15/835,909

(22) Filed: Dec. 8, 2017

(65) Prior Publication Data
US 2019/0181092 A1 Jun. 13, 2019

(51) Int. Cl.
*H01L 21/56* (2006.01)
*H01L 21/60* (2006.01)
(Continued)

(52) U.S. Cl.
CPC .... *H01L 23/5386* (2013.01); *H01L 21/76802* (2013.01); *H01L 21/76829* (2013.01); *H01L 22/14* (2013.01); *H01L 23/3128* (2013.01); *H01L 23/5384* (2013.01); *H01L 24/94* (2013.01); *H01L 25/0655* (2013.01); *H01L 24/16* (2013.01); *H01L 24/17* (2013.01); *H01L 24/81* (2013.01); *H01L 24/83* (2013.01); *H01L 25/10* (2013.01); *H01L 2224/04105* (2013.01); *H01L 2224/058* (2013.01);
(Continued)

(58) Field of Classification Search
CPC ......... H01L 21/76802; H01L 21/76829; H01L 22/14; H01L 23/5384; H01L 23/5386; H01L 24/94; H01L 21/6835; H01L 23/5381; H01L 23/5383; H01L 24/95; H01L 25/0652; H01L 25/0655; H01L 25/50
See application file for complete search history.

(56) References Cited

U.S. PATENT DOCUMENTS

| 7,969,009 | B2 | 6/2011 | Chandrasekaran |
| 8,097,490 | B1* | 1/2012 | Pagaila ................. H01L 21/561 438/106 |

(Continued)

OTHER PUBLICATIONS

High-Bandwidth IC Interconnects With Silicon Interposers and Bridges for 3D Multi-Chip Integration and Packaging; Boping WU, Intel Research, Hillsboro, OR, USA, Email: bennywu@ieee.org (3 pages).

(Continued)

*Primary Examiner* — Mary A Wilczewski
(74) *Attorney, Agent, or Firm* — Moser Taboada; Alan Taboada (57) ABSTRACT

A wafer-level bridge die is affixed with an adhesive layer to a redistribution layer (RDL) that has been temporarily bonded to a carrier. Electrical interconnects are formed on the RDL and on the bridge die and encapsulated in a first mold layer. A plurality of dies are coupled to the RDL and the bridge die such that a die is electrically connected to at least one electrical interconnect of the RDL and to at least one electrical interconnect of the bridge die. A second mold layer is formed on the first mold layer to encapsulate the plurality of dies. The temporary bond is then broken and the carrier is removed, exposing the RDL connections.

10 Claims, 7 Drawing Sheets

(51) Int. Cl.
*H01L 23/31* (2006.01)
*H01L 23/538* (2006.01)
*H01L 21/66* (2006.01)
*H01L 21/768* (2006.01)
*H01L 23/00* (2006.01)
*H01L 25/065* (2006.01)
*H01L 25/10* (2006.01)

(52) U.S. Cl.
CPC ......... *H01L 2224/0579* (2013.01); *H01L 2224/05639* (2013.01); *H01L 2224/05647* (2013.01); *H01L 2224/05684* (2013.01); *H01L 2224/16145* (2013.01); *H01L 2224/16235* (2013.01); *H01L 2224/18* (2013.01); *H01L 2224/2919* (2013.01); *H01L 2224/32225* (2013.01)

(56) References Cited

U.S. PATENT DOCUMENTS

| | | | |
|---|---|---|---|
| 8,227,904 B2 | 7/2012 | Braunisch et al. | |
| 8,704,384 B2 | 4/2014 | Wu et al. | |
| 9,368,450 B1* | 6/2016 | Gu | H01L 23/5385 |
| 9,379,090 B1* | 6/2016 | Syed | H01L 25/0655 |
| 9,443,561 B1 | 9/2016 | Roberts et al. | |
| 9,443,824 B1* | 9/2016 | We | H01L 25/0652 |
| 9,543,249 B1* | 1/2017 | Hu | H01L 23/5383 |
| 9,607,967 B1* | 3/2017 | Shih | H01L 21/6835 |
| 9,653,428 B1* | 5/2017 | Hiner | H01L 24/73 |
| 9,761,559 B1* | 9/2017 | Shih | H01L 25/0652 |
| 10,128,212 B2* | 11/2018 | Shih | H01L 25/0652 |
| 10,163,798 B1* | 12/2018 | Alur | H01L 23/3128 |
| 10,163,860 B2* | 12/2018 | Hsu | H01L 25/0657 |
| 10,312,220 B2* | 6/2019 | Hiner | H01L 24/73 |
| 10,504,847 B2* | 12/2019 | Chang | H01L 24/97 |
| 2006/0038272 A1 | 2/2006 | Edwards | |
| 2009/0267238 A1* | 10/2009 | Joseph | H01L 23/49833 257/777 |
| 2011/0149539 A1* | 6/2011 | Shi | H01L 23/13 361/764 |
| 2011/0233789 A1* | 9/2011 | Drost | H01L 23/48 257/777 |
| 2011/0285006 A1* | 11/2011 | Weng | H01L 23/13 257/686 |
| 2014/0117552 A1* | 5/2014 | Qian | H01L 23/49827 257/762 |
| 2014/0264791 A1* | 9/2014 | Manusharow | H01L 25/0655 257/666 |
| 2014/0353827 A1* | 12/2014 | Liu | H01L 24/33 257/751 |
| 2015/0048515 A1* | 2/2015 | Zhang | H01L 23/5381 257/774 |
| 2015/0116965 A1* | 4/2015 | Kim | H05K 1/11 361/767 |
| 2015/0279817 A1* | 10/2015 | Zhang | H01L 25/0657 257/777 |
| 2015/0364422 A1 | 12/2015 | Zhai et al. | |
| 2015/0371951 A1* | 12/2015 | Yeh | H01L 25/50 257/774 |
| 2016/0071818 A1* | 3/2016 | Wang | H01L 25/0655 257/774 |
| 2016/0085899 A1* | 3/2016 | Qian | G06F 17/5077 257/774 |
| 2016/0093571 A1* | 3/2016 | Kim | H01L 21/486 257/774 |
| 2016/0133571 A1* | 5/2016 | Lee | H01L 21/56 257/774 |
| 2016/0141234 A1* | 5/2016 | We | H01L 23/5385 361/767 |
| 2017/0263544 A1* | 9/2017 | Hiner | H01L 21/56 |
| 2017/0301625 A1* | 10/2017 | Mahajan | H01L 23/5381 |
| 2017/0365580 A1* | 12/2017 | Shih | H01L 25/0652 |
| 2018/0005945 A1* | 1/2018 | Pietambaram | H01L 23/5226 |
| 2018/0033770 A1* | 2/2018 | Hsu | H01L 25/105 |
| 2018/0040548 A1* | 2/2018 | Kim | H01L 21/6835 |
| 2018/0182699 A1* | 6/2018 | Lai | H01L 23/5223 |
| 2018/0182707 A1* | 6/2018 | Elsherbini | H01L 23/5381 |
| 2018/0366436 A1* | 12/2018 | Wang | H01L 25/0652 |
| 2019/0006318 A1* | 1/2019 | Waidhas | H01L 21/486 |
| 2019/0027431 A1* | 1/2019 | Feng | H01L 23/49838 |
| 2019/0051633 A1* | 2/2019 | Bhagavat | H01L 23/293 |
| 2019/0067034 A1* | 2/2019 | Pachamuthu | H01L 21/6835 |
| 2019/0096815 A1* | 3/2019 | Belonio, Jr. | H01L 21/4853 |
| 2019/0115319 A1* | 4/2019 | Hiner | H01L 24/73 |
| 2019/0181092 A1* | 6/2019 | Hsiung | H01L 23/5386 |
| 2019/0326221 A1* | 10/2019 | Bhagavat | H01L 23/5383 |
| 2019/0326257 A1* | 10/2019 | Agarwal | H01L 24/08 |
| 2020/0006232 A1* | 1/2020 | Pietambaram | H01L 21/4853 |

OTHER PUBLICATIONS

Higher Density PoP Semiconductor Packaging Solution: Bridging the Infrastructure Gap Between Wire-Bond and TSV Interconnect, Vern Solberg, Charles Woychik, Wael Zohni and Ilyas Mohammed, Invensas Corporation, San Jose, California USA (52 pages).

* cited by examiner

METHODS AND APPARATUS FOR WAFER-LEVEL DIE BRIDGE

FIELD

Embodiments of the present principles generally relate to semiconductor processes.

BACKGROUND

Integrated circuits are often formed from different processes depending on the desired functionality. Multiple chips of one function are generally constructed on a single wafer and then cut apart to create a single die or "chip." In other instances, the multiple chips can have multiple functions and include die partitioning and multiple functional die integration. The chips have inputs and outputs ("I/O") that need to be electrically connected to I/O connections of other chips. For example, a processing chip may need to be connected to a memory chip to properly perform a function. One way to electrically join two chips is to use an active or passive device known as a "bridge." A bridge provides a pathway from an I/O connection of one chip to an I/O connection of another chip. The bridge can be a silicon die with connecting routes that are passive or have an active function. However, using a bridge to provide the connections often increases the manufacturing complexity of the semiconductor device and may, therefore, also limit who can manufacture the semiconductor device. The foregoing is often true for bridges formed in substrates which can limit the process to foundries (manufacturers of chips) as opposed to Outsourced Assembly and Test (OSAT) facilities (limited to wafer level manufacturing). Some wafer level processes that form redistribution layers (RDL) after bridge and chip placement risk having to discard the expensive chips due to low RDL yields.

Thus, the inventors have provided an improved method and apparatus for forming a wafer-level die bridge.

SUMMARY

Some embodiments of a method of forming a wafer level bridge die include forming a redistribution layer and affixing a bridge die on the RDL, the bridge die having electrical connections on an exposed surface opposite of the RDL.

Some embodiments of a method of forming a wafer level bridge die further include forming the RDL on a carrier; or affixing the bridge die on the RDL using an adhesive between the bridge die and the RDL; or forming at least one electrical interconnect on the RDL; forming at least one electrical interconnect on the bridge die; forming a first mold layer over the RDL and the bridge die; and coupling a plurality of dies to the RDL and to the bridge die such that a die is electrically connected to at least one electrical interconnect of the RDL and to at least one electrical interconnect of the bridge die; or forming a second mold layer on the first mold layer and on the plurality of dies; or forming at least one integrated passive device on the first mold layer; and forming a second mold layer on the first mold layer, on the plurality of dies, and on the at least one integrated passive device; or using a copper-based material to form at least one electrical interconnect on the RDL or at least one electrical interconnect on the bridge die; or forming at least one electrical interconnect on the RDL; forming at least one electrical interconnect on the bridge die; forming at least one first portion of at least one through mold via (TMV) on the RDL; forming a first mold layer over the RDL and the bridge die; forming at least one second portion of the at least one TMV; coupling a plurality of dies to the RDL and to the bridge die such that a die is electrically connected to at least one electrical interconnect of the RDL and to at least one electrical interconnect of the bridge die; and forming a second mold layer on the first mold layer and on the plurality of dies, the at least one TMV having an electrical connection at a top surface of the second mold layer for supporting package-on-package (PoP) electrical connections; or forming the at least one TMV using an electroplating process.

Some embodiments of a method of forming a wafer level bridge die include temporarily bonding a redistribution layer on a carrier; affixing a bridge die on the RDL, the bridge die having electrical connections on an exposed surface opposite of the RDL; forming at least one electrical interconnect on the RDL; forming at least one electrical interconnect on the exposed surface of the bridge die; forming a first mold layer on the RDL and the bridge die; coupling a plurality of dies to the RDL and to the bridge die such that a die is electrically connected to at least one electrical interconnect of the RDL and to at least one electrical interconnect of the bridge die; forming a second mold layer on the first mold layer and on the plurality of dies; and removing the carrier from the RDL.

Some embodiments of a method of forming a wafer level bridge die further include affixing a thermal exchange layer to a top surface of at least one of the plurality of dies; or electrically connecting the RDL to a substrate or printed circuit board; or forming at least one integrated passive device on the first mold layer before forming the second mold layer; or forming at least one through mold via from the RDL to a top surface of the second mold layer.

Some embodiments of an apparatus for connecting semiconductor devices includes a redistribution layer (RDL); a bridge die; and an adhesive layer interposed between the RDL and the bridge die.

Some embodiments of an apparatus for connecting semiconductor devices further includes at least one electrical interconnect on the RDL; at least one electrical interconnect on the bridge die; and a first mold layer on the RDL and the bridge die; or a plurality of dies coupled to the RDL and to the bridge die such that a die is electrically connected to at least one of the at least one electrical interconnect of the RDL and to at least one of the at least one electrical interconnect of the bridge die; and a second mold layer on the first mold layer and on the plurality of dies; or a plurality of dies coupled to the RDL and to the bridge die such that a die is electrically connected to at least one of the at least one electrical interconnect of the RDL and to at least one of the at least one electrical interconnect of the bridge die; at least one integrated passive device on the first mold layer; and a second mold layer on the first mold layer, on the plurality of dies, and on the at least one integrated passive device; or at least one electrical interconnect on the RDL; at least one integrated passive device on the RDL; at least one electrical interconnect on the bridge die; at least one first portion of at least one through mold via (TMV) on the RDL; and a first mold layer on the RDL and the bridge die; or at least one second portion of the at least one TMV; a plurality of dies coupled to the RDL and to the bridge die such that a die is electrically connected to at least one of the at least one electrical interconnect of the RDL and to at least one of the at least one electrical interconnect of the bridge die; and a second mold layer on the first mold layer and on the plurality of dies, the at least one TMV having an electrical connection at a top surface of the second mold layer for supporting package-on-package (PoP) electrical connections.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

A wafer-level die bridge is affixed to a redistribution layer (RDL). The RDL can be pre-fabricated and temporarily bonded to a carrier or formed directly on a carrier with a temporary bonding adhesive. RDLs, in general, have a low production yield (high failure rate). Fine pitch RDL structures are even more difficult to manufacture. By first pre-fabricating an RDL and attaching the RDL to a carrier or first forming an RDL on a carrier, any defective RDL can be discarded without discarding other valuable components, reducing overall production costs. Furthermore, since the RDL is constructed first, thermal budgets of other semiconductor devices, such as dies, do not limit the RDL formation process. Another advantage is that extended, high temperature curing of RDLs can be accomplished without risking damage to other costly components.

The bridge die is fabricated individually by following back-end of line (BEOL) process flows (e.g., dual damascene process) or standard RDL process flows (semi-additive processes) which can achieve less than 1/1 Line/Space (typically, 0.8/0.8 L/S or 0.4/0.4 um) designs. The fine pitch circuit is able to fulfill die-to-die interconnections needs. In addition, because the die bridge is produced at a wafer-level and does not require foundry work, the process is also highly compatible with Outsourced Assembly and Test (OSAT) facilities. If the RDL is constructed after die placement, most, if not all, OSAT facilities most likely would not have the alignment precision capabilities to properly create the RDL, limiting production to foundries and increasing manufacturing costs.

Because the RDL is formed first, fine line spacing of 2/2 or less is possible. The RDL is formed on a carrier which can possess a very smooth surface. When an RDL is formed over other mold layers and die, step-heights are formed at the die/mold intersections. The step-heights create a topography that is unsuitable for forming fine pitch RDLs, greatly reducing finer pitched RDL yields, and, subsequently, when an RDL process fails, increasing costs through the loss of manufacturing time and loss of die costs. An RDL first wafer-level die bridge process has the advantages of better control over the RDL processes (no die thermal budget concerns), increasing RDL quality (fine pitch control due to flat topography), and increasing RDL yields with no risk of losing expensive dies. A wafer-level die bridge process is also less costly than bridging schemes that use interposers. Size can also be reduced, because without the interposer, the dies become the limiting factor in sizes instead of the interposer. The size reduction permits the wafer-level bridge die to be compatible with larger packages (breakthrough in 2X reticle size).

Figure 1:
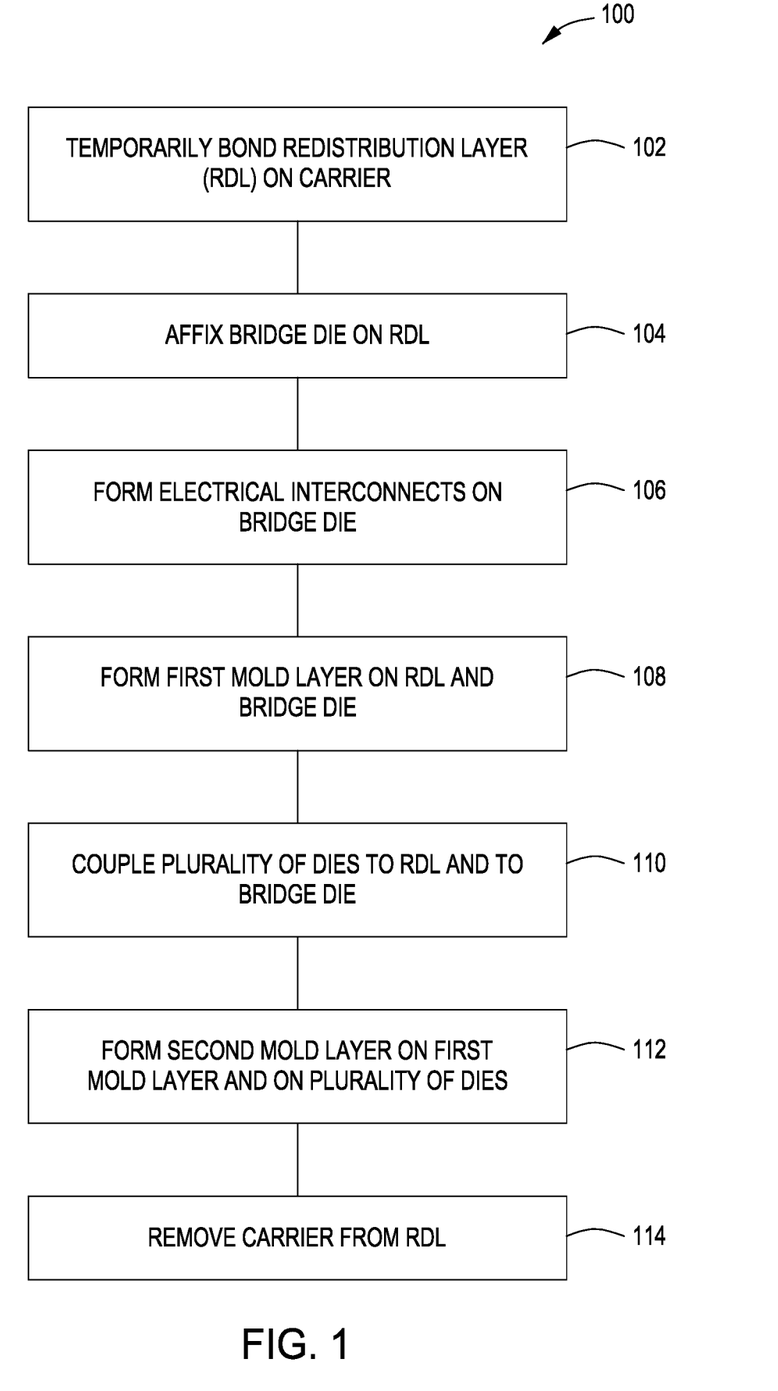
FIG. 1 is a method of forming a wafer level bridge die in accordance with some embodiments of the present principles.
Figure 3A:
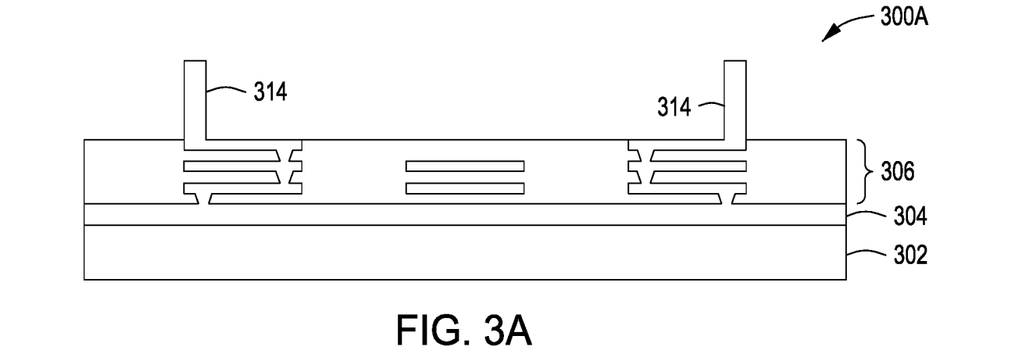
FIGS. 3A to 3G depict an apparatus formed from the method of FIG. 1 in accordance with some embodiments of the present principles.
Figure 3B:
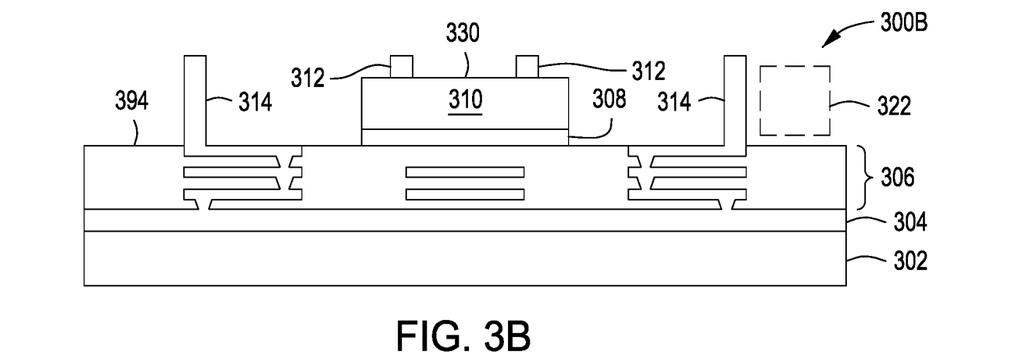

FIG. 1 illustrates a method 100 for forming an RDL first wafer-level bridge die in accordance with some embodiments of the present principles. The method 100 relates to apparatus shown in FIGS. 3A to 3G which will be referenced accordingly. In block 102, a structure 300A, as shown in FIG. 3A, includes an RDL 306, with at least one electrical interconnect 314 formed on the RDL 306, that is temporarily bonded to a carrier 302 with a bonding layer 304 or the RDL 306 and at least one electrical interconnect 314 are formed on the carrier 302 on the bonding layer 304. The carrier 302 can be made of a material such as glass, GaN, silicon, or polypropylene (pre-impregnated) substrates and the like. In block 104, a structure 300B, as shown in FIG. 3B, includes a bridge die 310 affixed on the RDL 306 with an adhesive 308. The adhesive 308 helps to locate and retain the bridge die during further processing, permitting the method 100 to be performed. The adhesive 308 can be an organic or inorganic substance or compound commonly used in wire bonding techniques. In block 106, the structure 300B further includes at least one electrical interconnect 312 formed on the bridge die 310 on an exposed surface 330 opposite of the RDL 306. The electrical interconnects 312, 314 allow connections to be made with the RDL 306 and the bridge die 310 after formation of subsequent layers (discussed below). The electrical interconnects 312, 314 are sometimes referred to as pillars and can be formed of conductive material such as, for example, metals including a copper-based material, a tungsten-based material, and a silver-based material and/or, for example, conductive polymer-based materials and the like. The electrical interconnects 312, 314 are typically formed using an electroplating process. An optional integrated passive device (IPD) 322 can also be placed on a top surface 394 of the RDL 306. The inclusion of IPDs is a further advantage of the method 100 over other techniques.

Figure 3C:
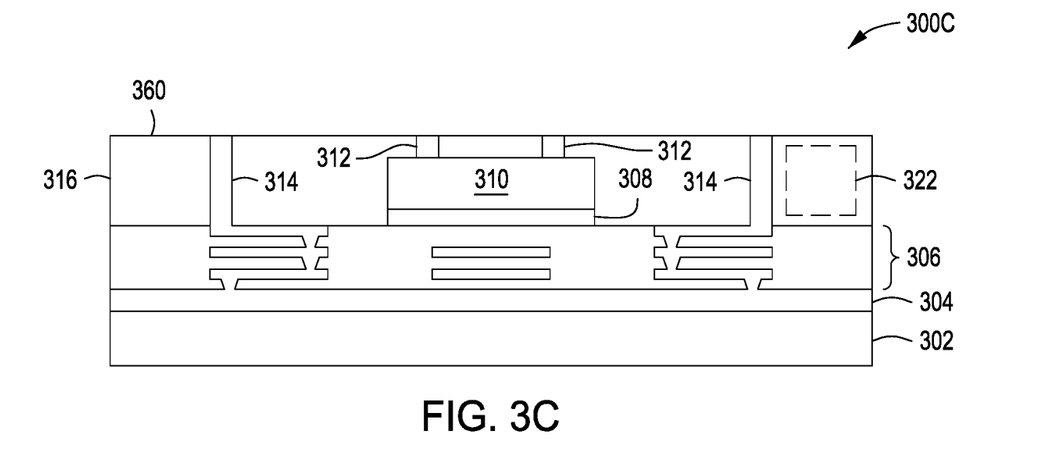
Figure 3D:
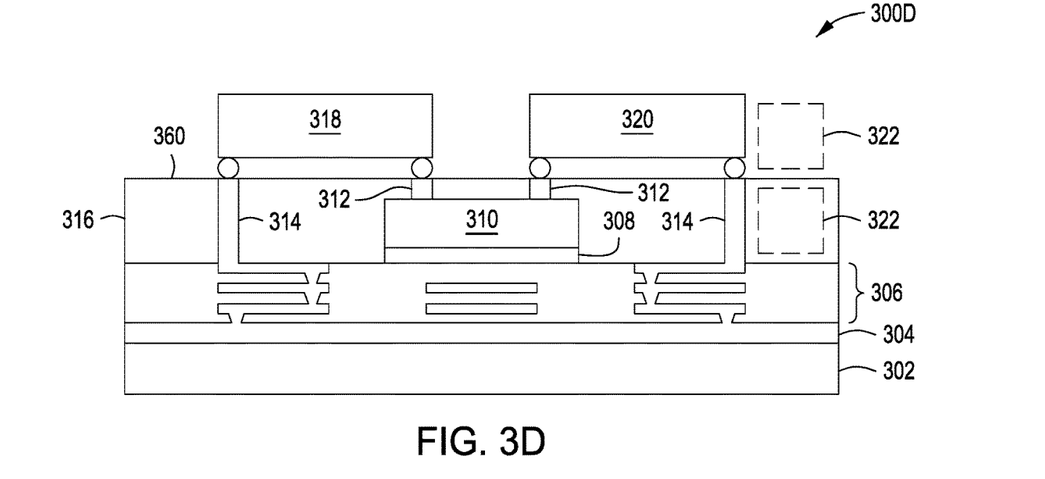

In block 108, a structure 300C, as shown in FIG. 3C, includes a first mold layer 316 formed on the RDL 306 and the bridge die 310. The first mold layer 316 can be formed from material such as, for example, polyimide, benzocyclobutene, polybenzoxazole, epoxy molding compound (EMC) (with or without filler), and the like. A planarization process, such as chemical mechanical polishing (CMP), can be employed after the formation of the first mold layer 316 to planarize a top surface 360 of the first mold layer 316 to further expose the electrical interconnects 312, 314. In block 110, a structure 300D, as shown in FIG. 3D, includes a plurality of dies 318, 320 placed on the first mold layer 316 and coupled to the RDL 306 and the bridge die 310 via the electrical interconnects 312, 314. Another optional integrated passive device (IPD) 322 can also be placed on the top surface 360 of the first mold layer 316

Figure 3E:
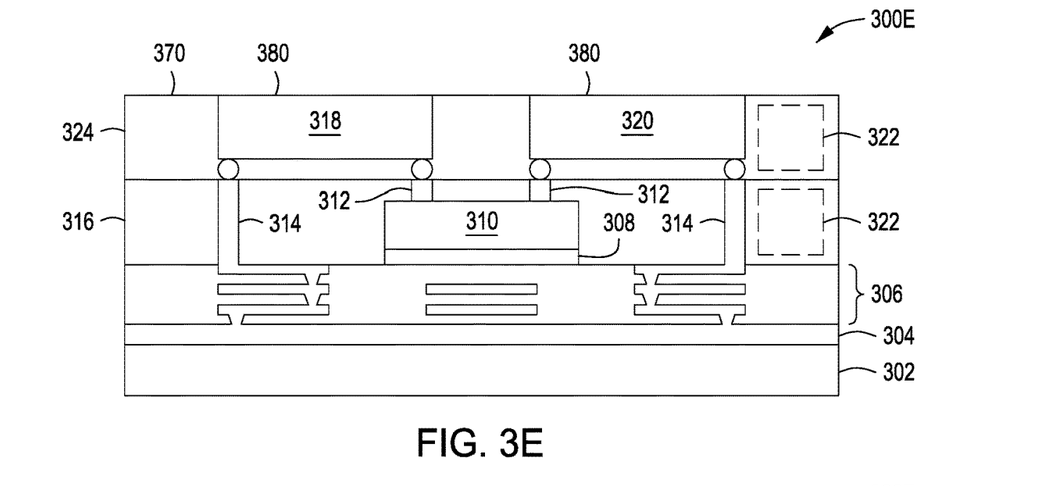
Figure 3F:
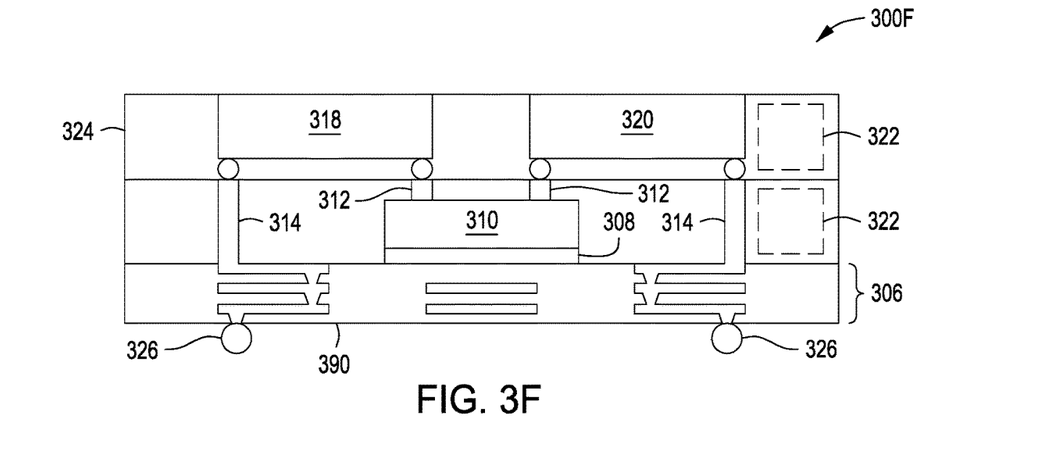
Figure 3G:
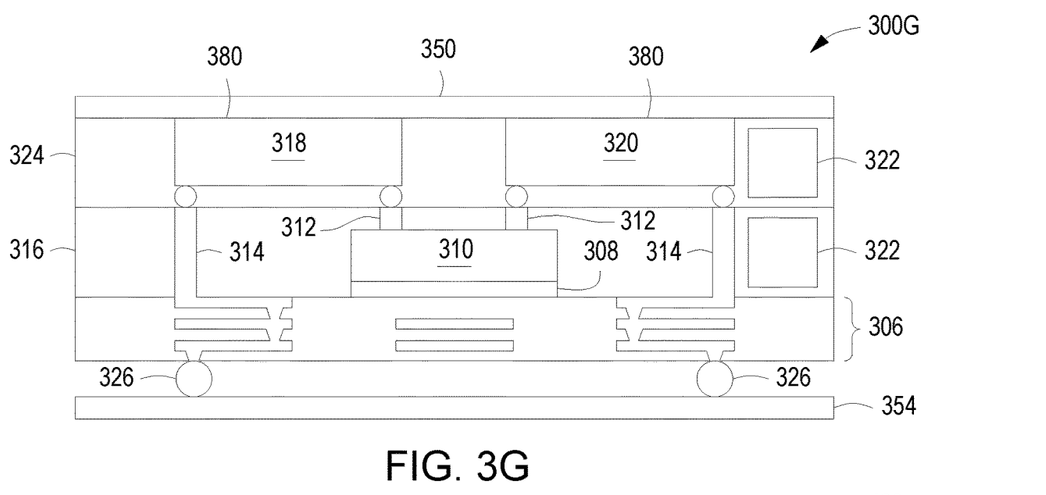

In block 112, a structure 300E, as shown in FIG. 3E, includes a second mold layer 324 formed on the first mold layer 316 and on the plurality of dies 318, 320 (and on optional IPDs). The second mold layer 324 can be formed from material such as, for example, polyimide, benzocyclobutene, polybenzoxazole, epoxy molding compound (EMC) (with or without filler), and the like. A planarization process, such as CMP, can be employed after the formation of the second mold layer 324 to planarize a top surface 370 of the second mold layer 324 to further expose top surfaces 380 of the plurality of dies 318, 320. The planarization can allow for better contact between the top surfaces 380 of the plurality of dies and a thermal exchange layer and the like (discussed below). In block 114, a structure 300F, as shown in FIG. 3F, has the carrier 302 removed (debonded) from the RDL 306. Ball bonding, for example, can be used to form optional balls 326 to connect a lower surface 390 of the RDL 306 to other circuitry. A structure 300G, as shown in FIG. 3G, includes an optional substrate or printed circuit board 354 and an optional thermal exchange layer 350 in contact with the top surfaces 380 of the plurality of dies 318, 320 to remove heat during operation of the plurality of dies 318, 320. The substrate or printed circuit board 354 can contain further circuitry that is connected via the optional balls 326 formed on the lower surface 390 of the RDL 306.

Figure 2:
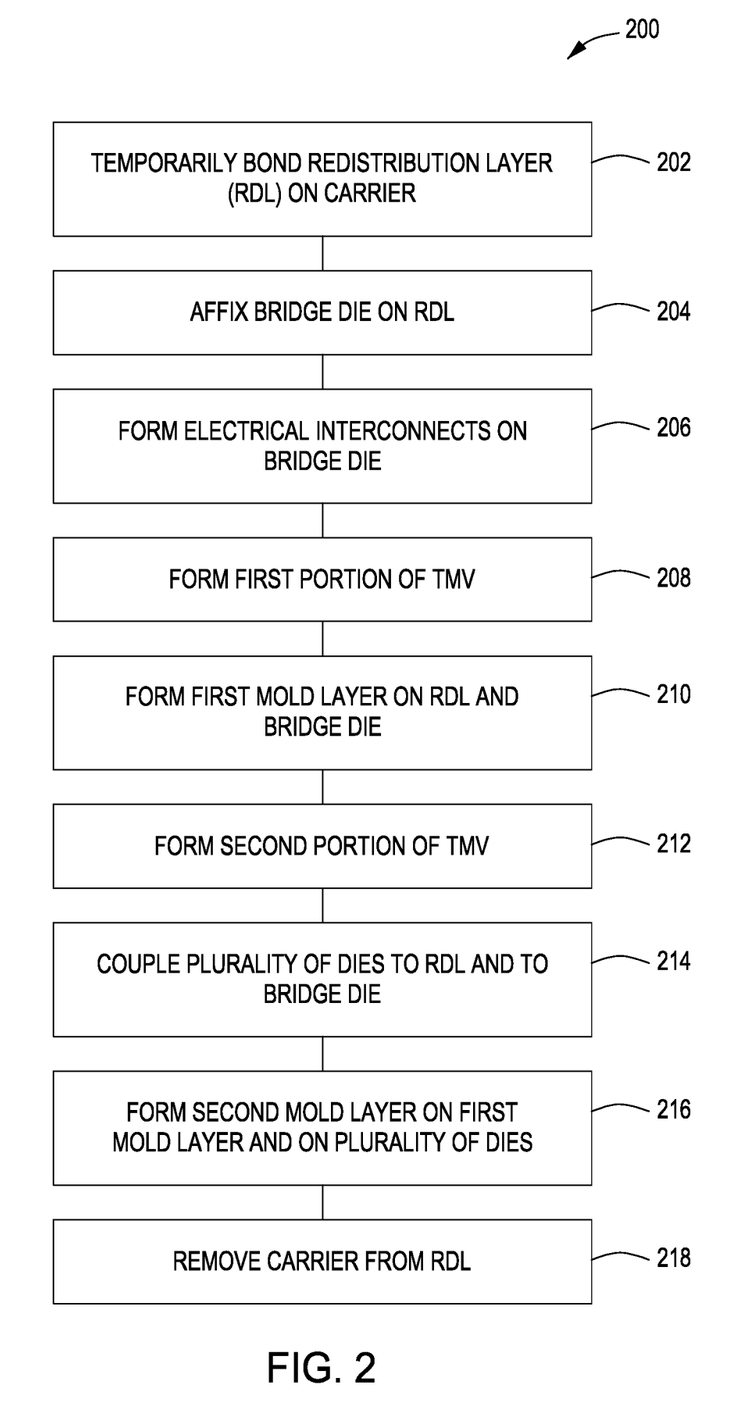
FIG. 2 is another method of forming a wafer level bridge die in accordance with some embodiments of the present principles.
Figure 4A:
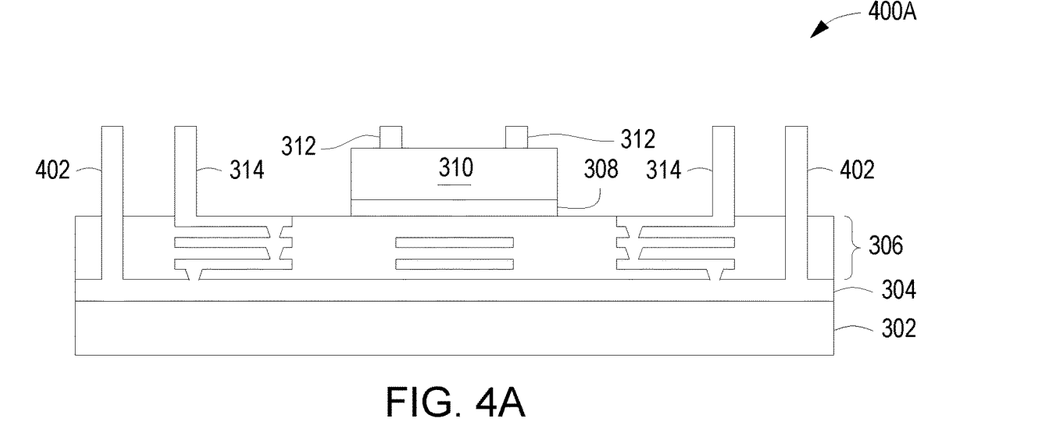
FIGS. 4A to 4F depict an apparatus formed from the method of FIG. 2 in accordance with some embodiments of the present principles.

FIG. 2 illustrates another method 200 for forming an RDL first wafer-level bridge die in accordance with some embodiments of the present principles. The method 200 relates to apparatus shown in FIGS. 4A to 4F which will be referenced accordingly. Like element numbers are used where appropriate to simplify the explanations. In block 202, a structure 400A, as shown in FIG. 4A, includes an RDL 306 that is temporarily bonded to a carrier 302 with a bonding layer 304 or the RDL 306 is formed on the carrier 302 on the bonding layer 304. The carrier 302 can be made of a material such as glass, GaN, silicon, or polypropylene (pre-impregnated) substrates and the like. In block 204, the structure 400A further includes a bridge die 310 affixed on the RDL 306 with an adhesive 308. The adhesive 308 helps to locate and retain the bridge die during further processing, permitting the method 200 to be performed. The adhesive 308 can be an organic or inorganic substance commonly used in wire bonding techniques.

In block 206, the structure 400A further includes at least one electrical interconnect 312 formed on the bridge die 310 on an exposed surface 330 opposite of the RDL 306. The electrical interconnects 312, 314 allow connections to be made with the RDL 306 and the bridge die 310 after formation of subsequent layers (discussed below). The electrical interconnects 312, 314 are sometimes referred to as pillars and can be formed of conductive material such as, for example, metals including a copper-based material, a tungsten-based material, and a silver-based material and/or, for example, conductive polymer-based materials and the like. The electrical interconnects 312, 314 are typically formed using an electroplating process. In block 208, the structure 400A further includes at least one first portion 402 of at least one through mold via (TMV) (406 in FIGS. 4C-4E) that extends through the RDL 306. The at least one first portion 402 of the at least one TMV 406 can be formed of similar materials (metals, conductive polymers, etc.) and with similar processes as the electrical interconnects 312, 314 including an electroplating process and the like. Although not illustrated, the at least one TMV 406 can be electrically connected to the RDL 306. The inclusion of TMVs is a further advantage of the method 200 over other techniques.

Figure 4B:
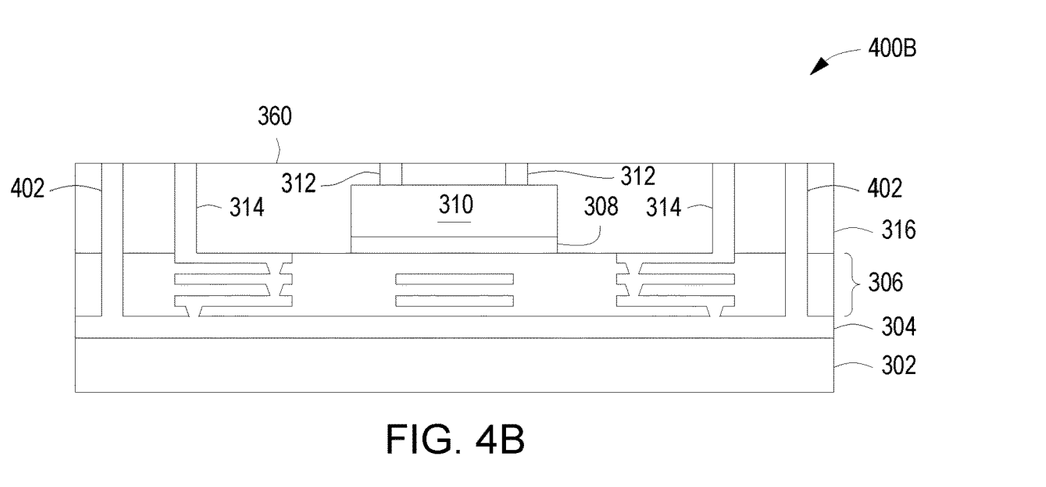
Figure 4C:
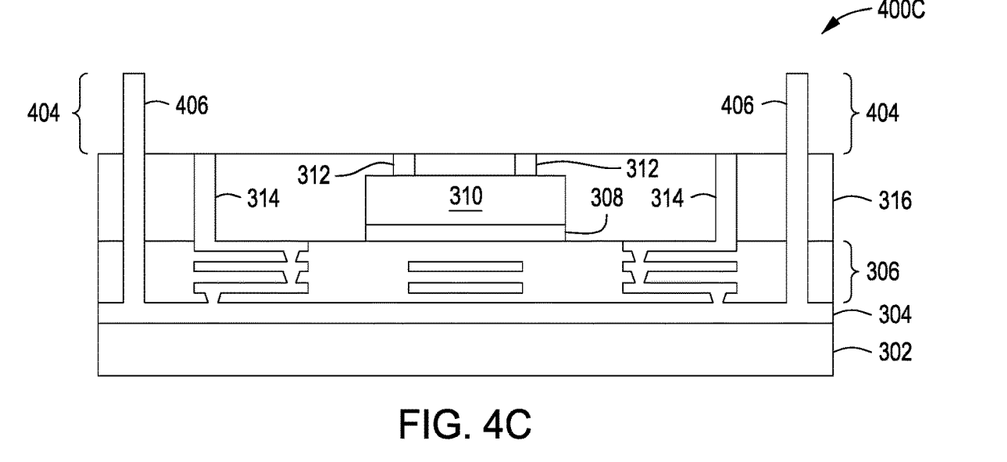

In block 210, a structure 400B, as shown in FIG. 4B, includes a first mold layer 316 formed on the RDL 306 and the bridge die 310. A planarization process, such as CMP, can be employed after the formation of the first mold layer 316 to planarize a top surface 360 of the first mold layer 316 to further expose the electrical interconnects 312, 314 and the at least one first portion 402 of the at least one TMV 406. In block 212, a structure 400C, as shown in FIG. 4C, includes at least one second portion 404 of the at least one TMV 406. The at least one second portion 404 of the at least one TMV 406 can be formed, for example, using an electroplating process and the like to form the at least one second portion 404 on the at least one first portion 402 of the at least one TMV 406.

Figure 4D:
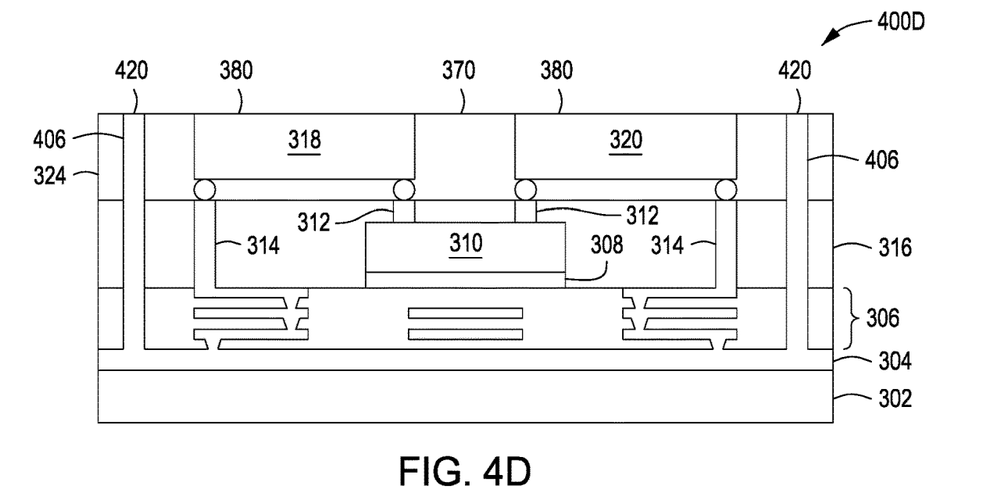

In block 214, the structure 400D, as shown in FIG. 4D, includes a plurality of dies 318, 320 placed on the first mold layer 316 and coupled to the RDL 306 and the bridge die 310 via the electrical interconnects 312, 314. An optional integrated passive device (IPD) 322 (not shown) can also be placed on the top surface 360 of the first mold layer 316 along with the at least one TMV 406 with a top surface 420. In block 216, the structure 400D further includes a second mold layer 324 formed on the first mold layer 316 and on the plurality of dies 318, 320 (and on the optional IPDs). A planarization process, such as CMP, can be employed after the formation of the second mold layer 324 to planarize a top surface 370 of the second mold layer 324 to further expose top surfaces 380 of the plurality of dies 318, 320. The planarization can allow for better contact between the top surfaces 380 of the plurality of dies and a thermal exchange layer and the like (discussed above).

Figure 4E:
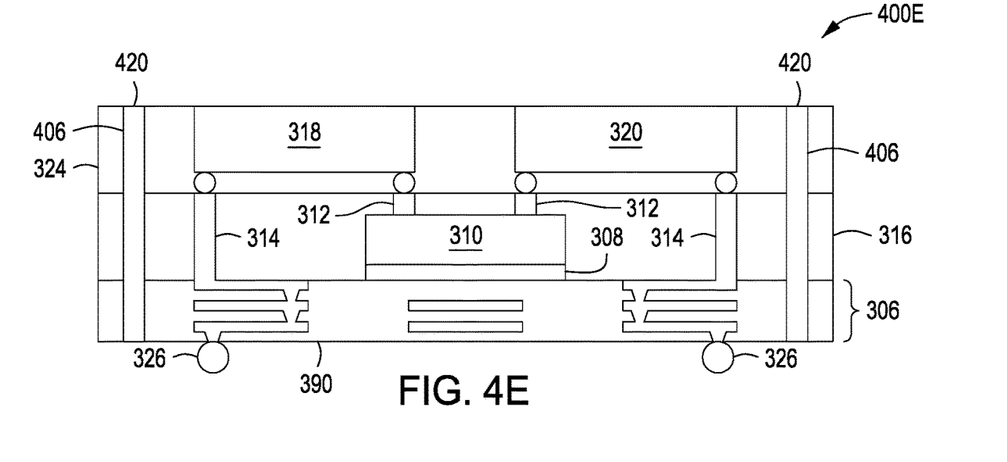
Figure 4F:
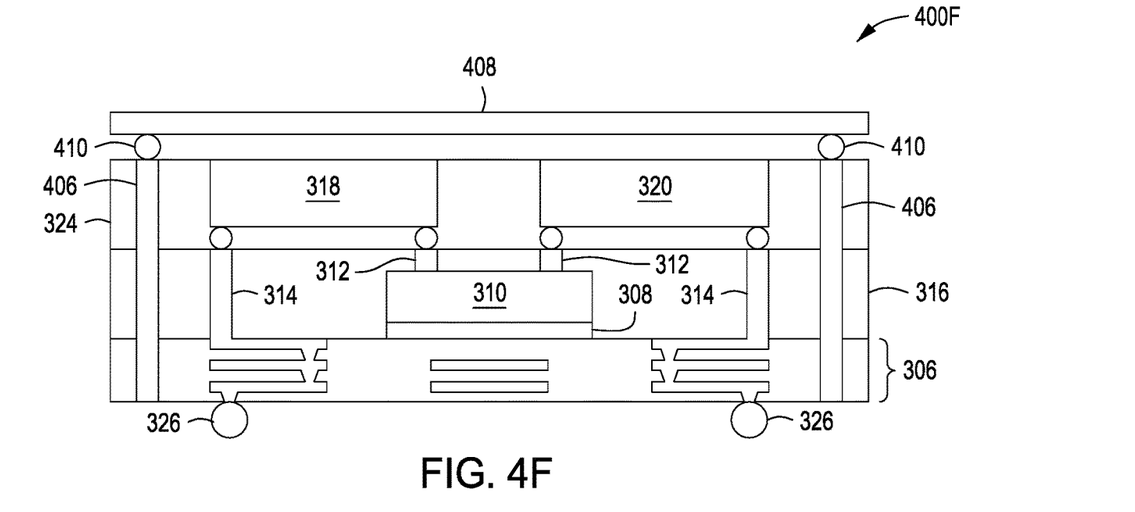

In block 218, a structure 400E, as shown in FIG. 4E, has the carrier 302 removed (debonded) from the RDL 306. Ball bonding, for example, can be used to form optional balls 326 to connect a lower surface 390 of the RDL 306 to other circuitry. A structure 400F, as shown in FIG. 4F, includes an optional semiconductor package 408 that is connected to the at least one TMV 406 via optional balls 410 formed from ball bonding of the top surface 420 of the at least one TMV 406. The at least one TMV 406 advantageously allows for supporting package-on-package (PoP) electrical connections.

The methods described above have the advantages of higher precision in the placement of dies and bridge dies and significantly tighter tolerances of RDLs over substrate-based processes. The methods also have the advantage of being compatible with high temperature dielectrics because the RDL is constructed first (not limited by die thermal budgets). The methods also have the advantage of enabling OSATs to form the processes internally without foundry assistance.

While the foregoing is directed to embodiments of the present principles, other and further embodiments of the principles may be devised without departing from the basic scope thereof.

The invention claimed is:

1. A method of forming a wafer level bridge die, comprising:
   forming a redistribution layer (RDL);
   affixing a bridge die on the RDL, the bridge die having electrical connections on an exposed surface opposite of the RDL;
   forming at least one electrical interconnect on the RDL;
   forming at least one electrical interconnect on the bridge die;
   forming at least one first portion of at least one through mold via (TMV) on the RDL;

forming a first mold layer over the RDL and the bridge die;
forming at least one second portion of the at least one TMV;
coupling a plurality of dies to the RDL and to the bridge die such that a die is electrically connected to at least one electrical interconnect of the RDL and to at least one electrical interconnect of the bridge die; and
forming a second mold layer on the first mold layer and on the plurality of dies, the at least one TMV having an electrical connection at a top surface of the second mold layer for supporting package-on-package (PoP) electrical connections.

2. The method of claim 1, further comprising:
forming the at least one TMV using an electroplating process.

3. The method of claim 1, further comprising:
forming the RDL on a carrier.

4. The method of claim 1, further comprising:
affixing the bridge die on the RDL using an adhesive between the bridge die and the RDL.

5. The method of claim 1, further comprising:
forming at least one integrated passive device on the first mold layer; and
forming the second mold layer on the at least one integrated passive device.

6. The method of claim 1, further comprising:
using a copper-based material to form at least one electrical interconnect on the RDL or at least one electrical interconnect on the bridge die.

7. A method of forming a wafer level bridge die, comprising:
temporarily bonding a redistribution layer (RDL) on a carrier;
affixing a bridge die on the RDL, the bridge die having electrical connections on an exposed surface opposite of the RDL;
forming at least one electrical interconnect on the RDL;
forming at least one electrical interconnect on the exposed surface of the bridge die;
forming a first mold layer on the RDL and the bridge die;
coupling a plurality of dies to the RDL and to the bridge die such that a die is electrically connected to at least one electrical interconnect of the RDL and to at least one electrical interconnect of the bridge die;
forming a second mold layer on the first mold layer and on the plurality of dies;
removing the carrier from the RDL; and
forming at least one through mold via from the RDL to a top surface of the second mold layer.

8. The method of claim 7, further comprising:
affixing a thermal exchange layer to a top surface of at least one of the plurality of dies.

9. The method of claim 7, further comprising:
electrically connecting the RDL to a substrate or printed circuit board.

10. The method of claim 7, further comprising:
forming at least one integrated passive device on the first mold layer before forming the second mold layer.

* * * * *